United States Patent [19]

Turner

[11] 4,184,111
[45] Jan. 15, 1980

[54] DRIVER FOR SOLAR CELL I-V CHARACTERISTIC PLOTS

[76] Inventor: Alan M. Lovelace, Acting Administrator of the National Aeronautics and Space Administration, with respect to an invention of Gary B. Turner, Pasadena, Calif.

[21] Appl. No.: 928,128

[22] Filed: Jul. 26, 1978

[51] Int. Cl.² .............................................. G01R 31/24
[52] U.S. Cl. ................................ 324/404; 324/158 D
[58] Field of Search ..................... 324/20 R, 23, 158 D

[56] References Cited

U.S. PATENT DOCUMENTS

| | | | |
|---|---|---|---|
| 3,745,454 | 7/1973 | Nikirk | 324/158 D |
| 3,919,639 | 11/1975 | Graff | 324/158 D |
| 4,051,437 | 9/1977 | Lile | 324/158 D |
| 4,125,806 | 11/1978 | Takata | 324/158 D |

*Primary Examiner*—M. Tokar
*Attorney, Agent, or Firm*—Paul F. McCaul; John R. Manning; Monte F. Mott

[57] ABSTRACT

A bipolar voltage ramp generator applies a linear voltage through a resistor to a solar cell for plotting its current versus voltage (I-V) characteristic between short circuit and open circuit conditions, with automatic stops at the end points. The resistor serves the multiple purpose of providing a current sensing resistor, setting the full-scale current value, and providing a load line with a slope approximately equal to one, such that it will pass through the origin and the approximate center of the I-V curve with about equal distance from that center to each of the end points.

7 Claims, 3 Drawing Figures

$V_{OC}$ = OPEN CIRCUIT (NO LOAD CURRENT)

$I_{SC}$ = SHORT CIRCUIT (MAXIMUM LOAD) CURRENT

DRIVER FOR SOLAR CELL I-V CHARACTERISTIC PLOTS

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

This invention relates to apparatus for evaluation of the current versus voltage (I-V) parameter of solar cells, and more particularly to a circuit for varying the load aplied to a solar cell between short circuit and open circuit while simultaneously driving an X-Y recorder for display of the I-V curve of solar cells.

An energy shortage has stimulated a great deal of effort to develop more efficient solar photovoltaic cells. One of the important evaluation parameters of such cells is the current versus voltage (I-V) parameter displayed by sweeping the cell from open circuit to short circuit under standardized illumination, and displaying the current output of the cell as a function of load voltage.

The present method of generating such a parameter display is to connect the solar cell in series with a resistor R to a variable voltage source. The voltage developed across the resistor is a function of current through the solar cell for a given voltage from the source. The voltage across the resistor is therefore used as the Y (current) input to an X-Y plotter while the voltage across the solar cell is used as the X input to the plotter. A potentiometer is employed to vary the applied voltage for a given light level on the solar cell. Usually the voltage source consists of batteries capable of providing the anticipated test current at the desired test voltage, with the potentiometer placed across the center-tapped batteries so that the potentiometer arm voltage may be swept from negative (cell voltage zero) to positive (cell current zero), and vice versa.

This present method is not entirely satisfactory because to a large degree testing depends upon the skill of the operator and the care exercised. Testing is therefore somewhat of an art. Consequently curves for the same or similar cells obtained by various operators, differ. In part this is due to the conflicting requirements that potentiometer movement be rapid enough to prevent build-up of heat in the aluminated cell (which affects cell output and hence the test data), and yet slow enough to allow the recorder to follow the changing cell output faithfully, particularly around and past the knee of the curve.

Another problem arises from the difficulty of determining the location of end points $V_{oc}$ and $I_{sc}$ on the curve rapidly, as soon as the cell is illuminated and before heat build-up can occur. Since the I-V parameter is different when the cell is dark, the operator must estimate a suitable potentiometer position before the beginning of the test. It is desirable that the potentiometer be set initially so that the cell voltage is equal to, or slightly less than zero, but this cannot be determined until the cell is actually illuminated. When a setting is made initially, and the cell is then illuminated, it may be found that the resulting cell voltage is positive, in which case it is necessary to decrease the potentiometer setting until cell voltage is zero before sweeping from zero to $V_{oc}$ in order to obtain the I-V curve. On the other hand, it may be found that the cell voltage is so far negative that the recorder is overrunning past the Y axis. When the potentiometer setting is increased for the test it is difficult to estimate just how fast to move the potentiometer. The beginning of the curve may then include an initial jerky portion. These and like situations may make it necessary to rerun the test, and it thus may require a number of runs to obtain a suitable test curve result. The test can be made in the reverse direction instead, (i.e. with an initial potentiometer setting which will yield a cell current equal to, or slightly less than, zero) but exactly analogous problems arise in estimating the potentiometer setting. An automated test system which determines the end points quickly at the start of the test, and which provides a test voltage which varies at a suitable rate so that the recorder follows the changing output data faithfully, would produce more uniform test results regardless of operator skill, and in less test time to prevent build-up heat from affecting the test.

SUMMARY OF THE INVENTION

In accordance with the present invention, a voltage is applied to a solar cell through a series resistor in an arrangement for plotting the I-V characteristic curve of the cell that permits the voltage to be varied at a constant rate from the short circuit (voltage zero) point to an open circuit (current zero) point with a load line selected to provide substantially full scale deflection on the Y axis of an X-Y plotter at the short circuit condition that approximately equals the full scale deflection on the X axis at the open circuit condition. This selection automatically provides for an approximately constant tracing speed of the X-Y plotter. The arrangement includes an integrator comprised of a first operational amplifier with a feedback capacitor to its inverting input terminal functioning as a linear ramp generator to drive the solar cell through the series resistor selected for the cell to yield the desired load line with a slope substantially equal to one. A saturable operational amplifier having a differential input is connected with its noninverting input to the output of the ramp generator and its inverting input to the junction between the solar cell and the resistor so that while slewing from the short circuit to the open circuit condition, the amplifier goes into saturation at all times to provide a constant negative slewing input signal to the ramp generator, except when the solar cell is at open circuit. To slew from the open circuit to the short circuit condition, a second saturable operational amplifier having a differential input is connected with its non-inverting input terminal to the junction between the solar cell and the series resistor, and its inverting input terminal to the other side of the solar cell so that while slewing from the open circuit to the short circuit condition, the amplifier goes into saturation at all times to provide a constant positive slewing input signal to the ramp generator, except when the solar cell is at short circuit. A switch is provided to selectively apply the output of the first or the second saturable amplifier to the input of the ramp generator. In that manner, the time taken to sweep from the short circuit condition to the knee of the I-V curve is comparable to that taken to sweep from the knee to the open circuit condition. These polarities are, of course, relative to the polarity of the solar cell, and assume the negative terminal of the solar cell is connected to the inverting input terminal of the second saturatable operational amplifier in order to provide a curve in the first quadrant of an X-Y plot. Other polarities to plot in other quadrants could, of course, be provided without departing from the true spirit and scope of the invention.

The novel features that are considered characteristic of this invention are set forth with particularity in the appended claims. The invention will best be understood from the following description when read in connecting with the accompanying drawings.

DESCRIPTION OF PREFERRED EMBODIMENTS

Figure 1:
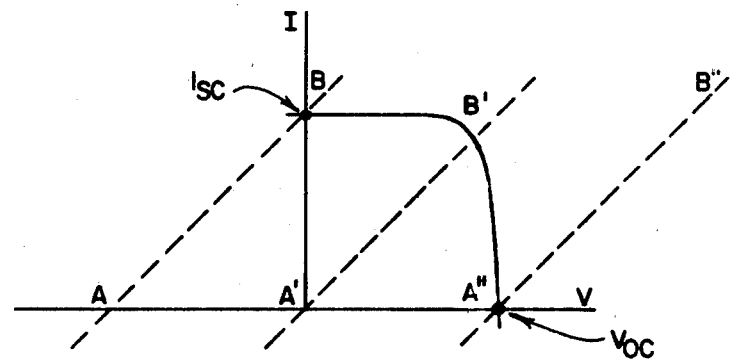

For the purpose of following an explanation of the invention summarized above, attention is directed to FIG. 1, and the load lines indicated thereon. The plot represents the power-producing (I-V) characteristics of a solar cell as graphically plotted in the first quadrant of an X-Y plot using an ink recorder or the equivalent. If a voltage is applied to the solar cell through a current sensing resistor, and if the voltage is varied at a constant rate from the short circuit current ($I_{sc}$) condition at point B to the open circuit voltage ($V_{oc}$) condition at point A", the recording stylus (or CRT beam) must speed up on passing the knee of the curve B'. On the other hand if the current is varied from open circuit ($V_{oc}$) to short circuit ($I_{sc}$) in the reverse direction, the stylus must also speed up on passing the knee of the I-V curve in the other direction. In either case, the current sensing resistor connected in series with the solar cell is required to provide a Y axis deflection input to the recorder.

The resistor serves the multiple purpose of providing a current sensing resistor, setting the full-scale current value, and providing a load line which shifts the trace at a substantially constant rate from B to A". The resistor is choosen to give approximately full scale deflection in the Y axis for the short circuit condition (a deflection that is approximately the same deflection in the X axis for the open circuit condition). This choice automatically sets the slope of the load line A-B to about one, which establishes the distance A-A' substantially equal to the distance A'-A" such that the distance from point B to the center of the knee in the curve is substantially equal to the distance from the center of the knee to the point A". The time taken to sweep from the short circuit condition to the knee of the curve is thus approximately equal to that taken to sweep from the knee of the curve to the open circuit condition, and vice versa.

Figure 2:
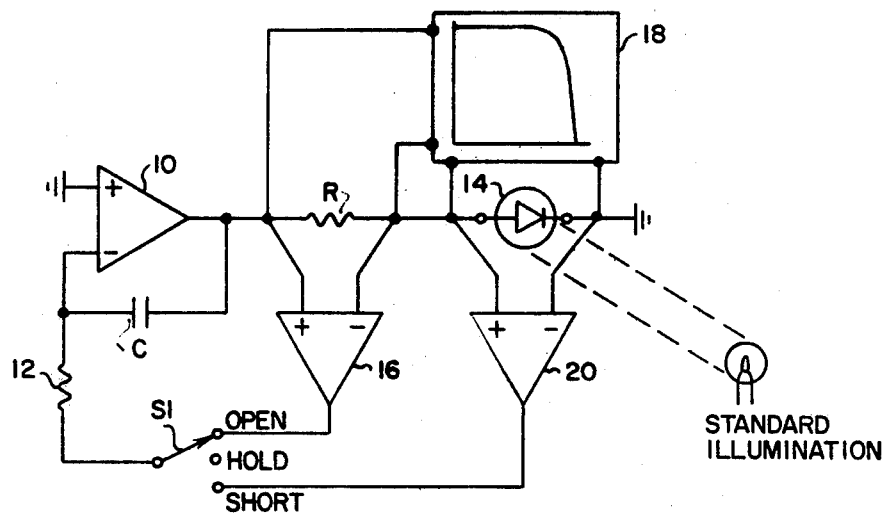

FIG. 2 illustrates the concept of this invention utilizing a bipolar voltage ramp generator comprising an operational amplifier 10 and feedback capacitor C for generating a positive, or negative, ramp output in response to a negative, or positive, input applied through a resistor 12. The output of the ramp generator is applied to a solar cell 14 through a series resistor R, the ends of which are connected to the differential inputs of a saturable operational amplifier 16 as shown in order that while sweeping from the short circuit ($I_{sc}$) condition to the open circuit ($V_{oc}$) condition, the saturating operational amplifier 16 will provide a constant negative input to the ramp generator, thus producing a positive ramp to the solar cell. The resistor R is selected to provide the load line A-B shown in FIG. 1.

The solar cell is connected with its positive terminal to the series resistor R and its negative terminal to circuit ground. The voltage developed across the solar cell 14 is sensed and applied to the X deflection circuitry of an X-Y recorder 18 to deflect the recording stylus (or CRT beam) along the X axis. The terminals of the current sensing resistor R are connected to the Y deflection circuitry of the recorder, thus producing a plot of the I-V characteristic in the first quadrant of an X-Y coordinate system in a conventional manner. However, as noted hereinbefore, it should be recognized that polarities could be reversed to plot the I-V characteristic in any one of the four quadrants.

To plot the I-V characteristics from the open circuit condition to the short condition, a second saturating amplifier 20 is connected to the solar cell to provide a constant positive output, except when the voltage across the solar cell is zero for the short circuit ($I_{sc}$) condition. This constant positive voltage output from the amplifier 20 is applied to the ramp generator through a switch S1 which disconnects the amplifier 16 from the input resistor 12 and connects the amplifier 20 to that resistor. In that manner, a bipolar ramp generator with a switchable resistor R are provided in order to vary the voltage applied to the solar cell between short circuit and open circuit conditions in either direction with automatic stops at the end points. Analog outputs proportional to the voltage and current are provided to drive the X and Y deflection circuitry of the recorder 18 at a constant speed, that is to say to move the load line from the position A-B through the position A'-B' to the position A"-B" with a constant slope as shown in FIG. 1.

Figure 3:
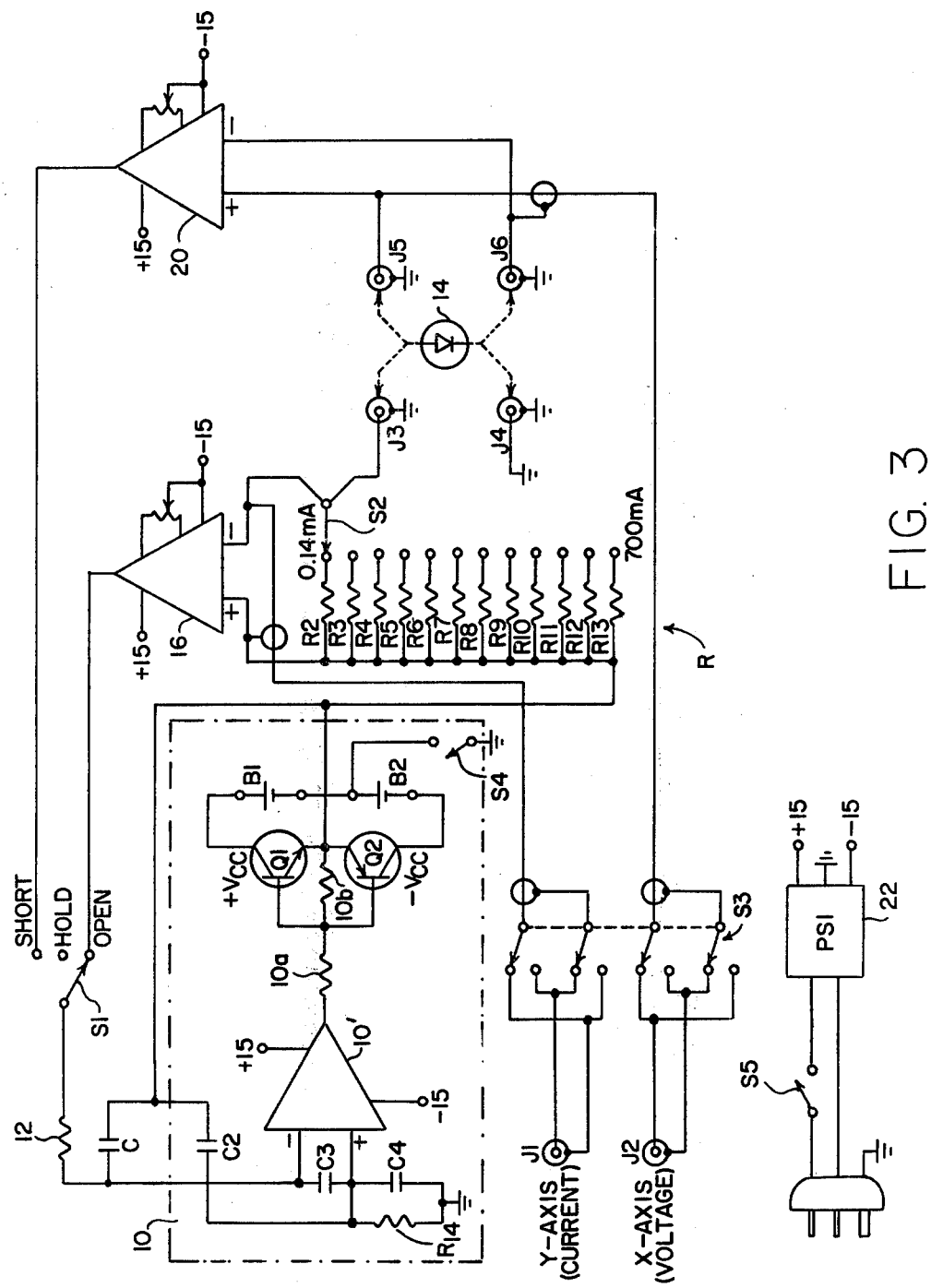

A preferred embodiment of the invention will now be described with reference to FIG. 3 in which components referred to in FIG. 2 will be identified by the same reference numeral where applicable in order to facilitate understanding how the concept of the invention is embodied in the circuits of FIG. 3. The operational amplifier 10 is in practice a high input impedance type operational amplifier 10' followed by power transistors Q1 and Q2, while saturable operational amplifiers 16 and 20 are 741-type operational amplifiers. The transistors Q1 and Q2 are biased by resistors 10a and 10b to provide a linear output from $-V_{cc}$ from a battery B2 through the transistor Q2 to $+V_{cc}$ from a battery B1 through the transistor Q1, thereby charging the capacitor C to produce a linear ramp voltage applied to a series resistor R selected from a bank of resistors R2-R13 using a switch S2. A network of capacitors C2, C3, C4 and resistor R14 provide feedback filtering for oscillation control. The series resistor R selected both determines the load line and measures the current. That measured current is then provided as a voltage signal to the Y axis of the recorder 18 (FIG. 2) through a jack J1. The voltage across the solar cell 14 is sensed to provide a signal to the X axis of the recorder through a jack J2. Ganged switches S3 are provided in order to reverse polarities on the X and Y axis for the connection made to the solar cell through jack J3-J6 in order that the I-V characteristic of the solar cell always be plotted in the first quadrant of an X-Y plot for a connection of the solar cell 14 of either polarity.

A switch S4 which connects a junction between batteries B1 and B2 to circuit ground permit power applied to the transistors Q1 and Q2 to be removed by opening that switch while the system is not in use. That switch is ganged with a master switch S5 used to control line voltage to a power supply unit 22 which provide +15 V and −15 V to the amplifiers 10', 16 and 20 as shown for operation of the system. When the switches S4 and S5 are closed, the amplifier 16 senses the current flowing through the series resistor and goes into saturation at all times except when the solar cell is at open circuit voltage as noted hereinbefore. This saturated output from the amplifier 16 provides a constant current input to the integrator made up of the amplifier 10 and capacitor C to provide a linear ramp of slope approximately equal to 1 for plotting the I-V characteristic of the solar cell from $I_{sc}$ to $V_{oc}$. For plotting the I-V characteristic in the opposite direction, the switch S1 is set to its alternate position to connect the saturating operational amplifier 20 to the input resistor 12.

In operation, switch S1 is set to SHORT and switches S4 and S5 closed. Switch S2 is labelled with the full-scale current values so the operator can choose an appropriate setting and then illuminate the cell. The plotter then displays the short circuit current. If the initial setting of S2 was inappropriate it may be easily and quickly adjusted until the current displayed is substantially full scale. Switch S1 is then thrown to OPEN and the curve is traced at nearly constant pen speed to the open circuit condition. If desired, switch S1 may be reversed for a return trace which may be stopped at any load condition by throwing S1 to HOLD.

Although a particular embodiment of the invention has been described and illustrated herein, it is recognized that modifications and equivalents may readily occur to those skilled in the art, particularly in the manner of providing the control switches and selecting the quadrant in which the I-V characteristic is to be plotted. Consequently it is intended that the claims be interpreted to cover such modifications and equivalents.

What is claimed is:

1. An instrument for plotting the current-voltage characteristic of a solar cell under standardized illumination using a Cartesian coordinate system wherein voltage applied to said cell is employed as a voltage control signal for one axis and current conducted through said cell is detected by a resistor in series therewith to produce a voltage control signal for the other axis, said resistor being selected to provide a load line with a slope approximately equal to one and serving the additional purposes of providing a current sensing resistor and setting the full scale current value, whereby said load line will pass through the origin and the approximate center of the plot of current versus voltage with about equal distance from that center to each of the end points.

2. An instrument as defined in claim 1 wherein said voltage applied to said cell is generated in a predetermined direction from zero towards a maximum by a linear ramp generator in response to an input signal of predetermined amplitude, and current-responsive means for generating said input signal in response to detection of any current conducted through said series resistor, whereby plotting said current-voltage characteristic is initiated at a short-circuit condition of applied voltage and automatically terminated when the applied voltage reaches an open circuit condition manifested by current through said resistor dropping to zero.

3. An instrument as defined in claim 1 wherein said voltage applied to said cell is generated in a predetermined direction from a maximum level toward zero by a linear ramp generator in response to an input signal of predetermined amplitude, and voltage responsive means for generating said input signal in response to detection of any voltage applied across said cell, whereby plotting said current-voltage characteristic is initiated at an open circuit condition of applied voltage and automatically terminated when the applied voltage reaches a short circuit condition manifested by voltage across said resistor dropping to zero.

4. An instrument as defined in claim 1 wherein said voltage applied to said cell is selectively generated in a predetermined direction from either zero towards a maximum by a linear ramp generator in response to an input signal of predetermined amplitude, and current-responsive means for generating said input signal in response to detection of any current conducted through said series resistor, whereby plotting said current-voltage characteristic is initiated at a short-circuit condition of applied voltage and automatically terminated when the applied voltage reaches an open circuit condition manifested by current through said resistor dropping to zero, or a maximum level toward zero by said linear ramp generator in response to an input signal of predetermined amplitude, and voltage-responsive means for generating said input signal in response to detection of any voltage applied across said cell, whereby plotting said current-voltage characteristic is initiated either at a short-circuit condition of applied voltage and automatically terminated when the applied voltage reaches an open circuit condition manifested by current through said resistor dropping to zero, or at an open circuit condition of applied voltage and automatically terminated when the applied voltage reaches a short-circuit condition manifested by voltage across said resistor dropping to zero, and including switching means for selecting between said current-responsive means and said voltage-responsive means for producing the voltage applied to the ramp generator.

5. An instrument as defined in claim 2 wherein said current-responsive means for generating said input signal in response to detection of any current conducted through said series resistor is comprised of a saturable operational amplifier having a differential input stage connected across said series resistor.

6. An instrument as defined in claim 3 wherein said voltage-responsive means for generating said input signal in response to detection of any voltage across said cell is comprised of a saturable operational amplifier having a differential input stage connected across said cell.

7. An instrument as defined in claim 4 wherein said current-responsive means for generating said input signal in response to detection of any current conducted through said series resistor is comprised of a saturable operational amplifier having a differential input stage connected across said series resistor, and wherein said voltage responsive means for generating said input signal in response to detection of any voltage across said cell is comprised of a saturable operational amplifier having a differential input stage connected across said cell.

* * * * *